United States Patent
Hioki

[19]

[11] Patent Number: 6,052,419
[45] Date of Patent: Apr. 18, 2000

[54] FREQUENCY ADJUSTING METHOD FOR USE WITH DIGITAL RECEIVER AND FREQUENCY ADJUSTING CIRCUIT THEREOF

[75] Inventor: Akira Hioki, Tokyo, Japan

[73] Assignee: NEC Corporation, Tokyo, Japan

[21] Appl. No.: 08/929,058

[22] Filed: Sep. 15, 1997

[30] Foreign Application Priority Data

Sep. 27, 1996 [JP] Japan .................................. 8-256238

[51] Int. Cl.[7] .................................................. H04L 27/06
[52] U.S. Cl. ..................... 375/344; 455/192.2; 455/182.2
[58] Field of Search ..................................... 375/344, 326, 375/339; 331/25; 455/192.1, 192.2, 182.2, 226.2, 255–259

[56] References Cited

U.S. PATENT DOCUMENTS

| | | | |
|---|---|---|---|
| 4,453,136 | 6/1984 | Kelland | 331/1 |
| 4,932,072 | 6/1990 | Toko | 455/76 |
| 5,335,364 | 8/1994 | Heinonen | 455/76 |
| 5,513,388 | 4/1996 | Suganuma | 455/258 |
| 5,574,998 | 11/1996 | Andoh | 455/182.2 |
| 5,727,030 | 3/1998 | Miyashita | 375/344 |

FOREIGN PATENT DOCUMENTS

| | | |
|---|---|---|
| 0412207A1 | 2/1991 | European Pat. Off. . |
| 0526836A2 | 2/1993 | European Pat. Off. . |
| 06006180A | 1/1994 | Japan . |
| 6-006180 | 1/1994 | Japan . |
| 6-6180 | 1/1994 | Japan . |
| 7-297779 | 11/1995 | Japan . |
| 8-288796 | 11/1996 | Japan . |

*Primary Examiner*—Amanda T. Le
*Assistant Examiner*—Dac V. Ha
*Attorney, Agent, or Firm*—Foley & Lardner

[57] ABSTRACT

A frequency adjusting circuit for use with a digital receiver is disclosed, the circuit comprising a means (mixers 3 and 4) for converting the frequency of a received digital signal into an intermediate frequency signal, a local oscillator (VCOs 7 and 8 and PLLs 9 and 10) for supplying a local oscillation signal to the frequency converting means, and a frequency adjusting means (20) for calculating a frequency deviation of the intermediate frequency signal (D1) for each sample, performing a predetermined calculation corresponding to the measured value, and controlling the oscillation frequency of the local oscillator corresponding to the obtained calculated value, wherein the frequency adjusting means compensates the calculated value corresponding to a receiving electric field intensity of the intermediate frequency signal. The frequency adjusting means includes a means (calculating portion 23) for detecting a variation value of the receiving electric field intensity, comparing the deviation value with a threshold value, and when the variation value is larger than the threshold value, removing the frequency deviation at that time from those that are input from the frequency adjusting means.

8 Claims, 5 Drawing Sheets

F I G. 2
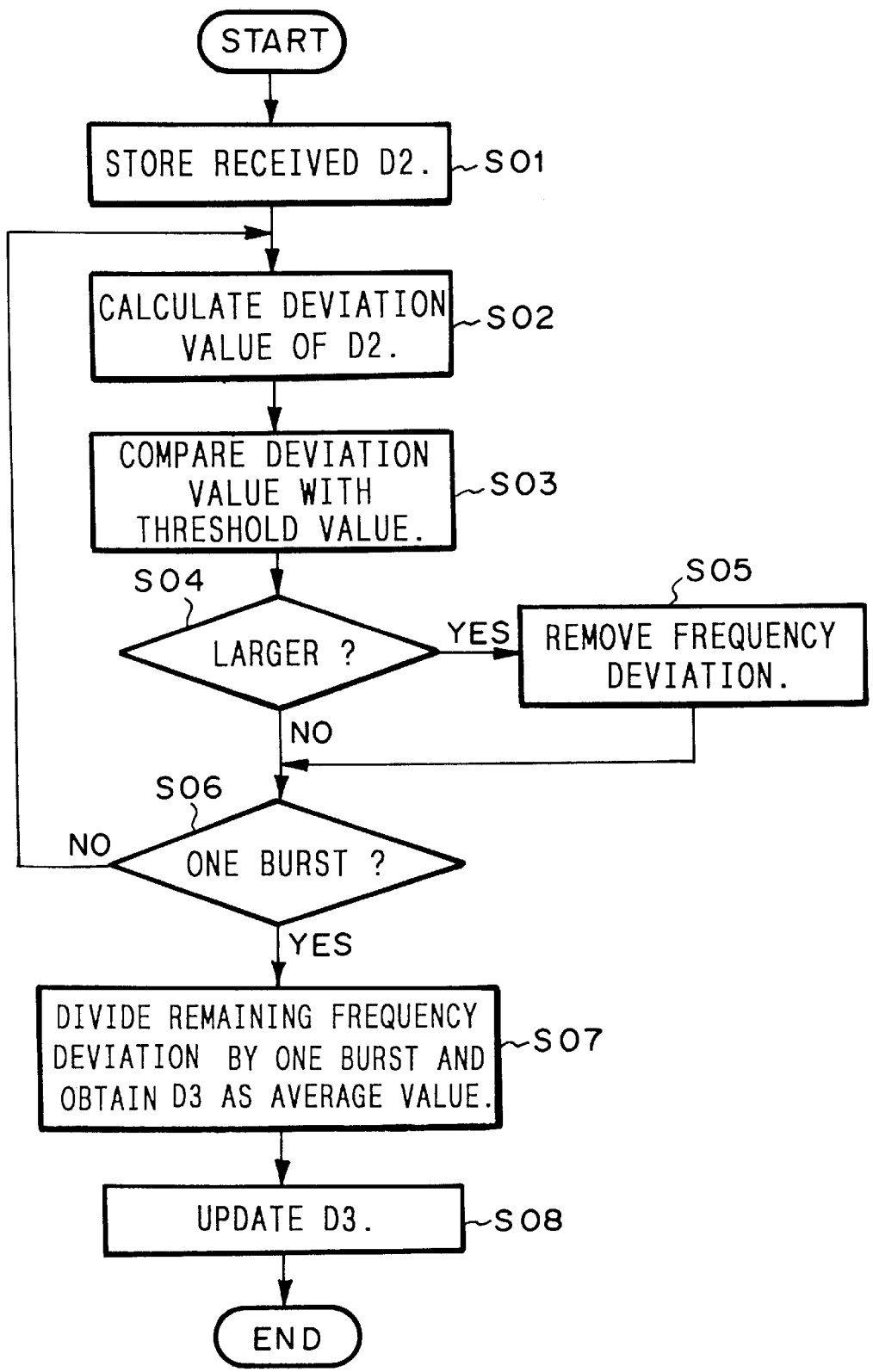

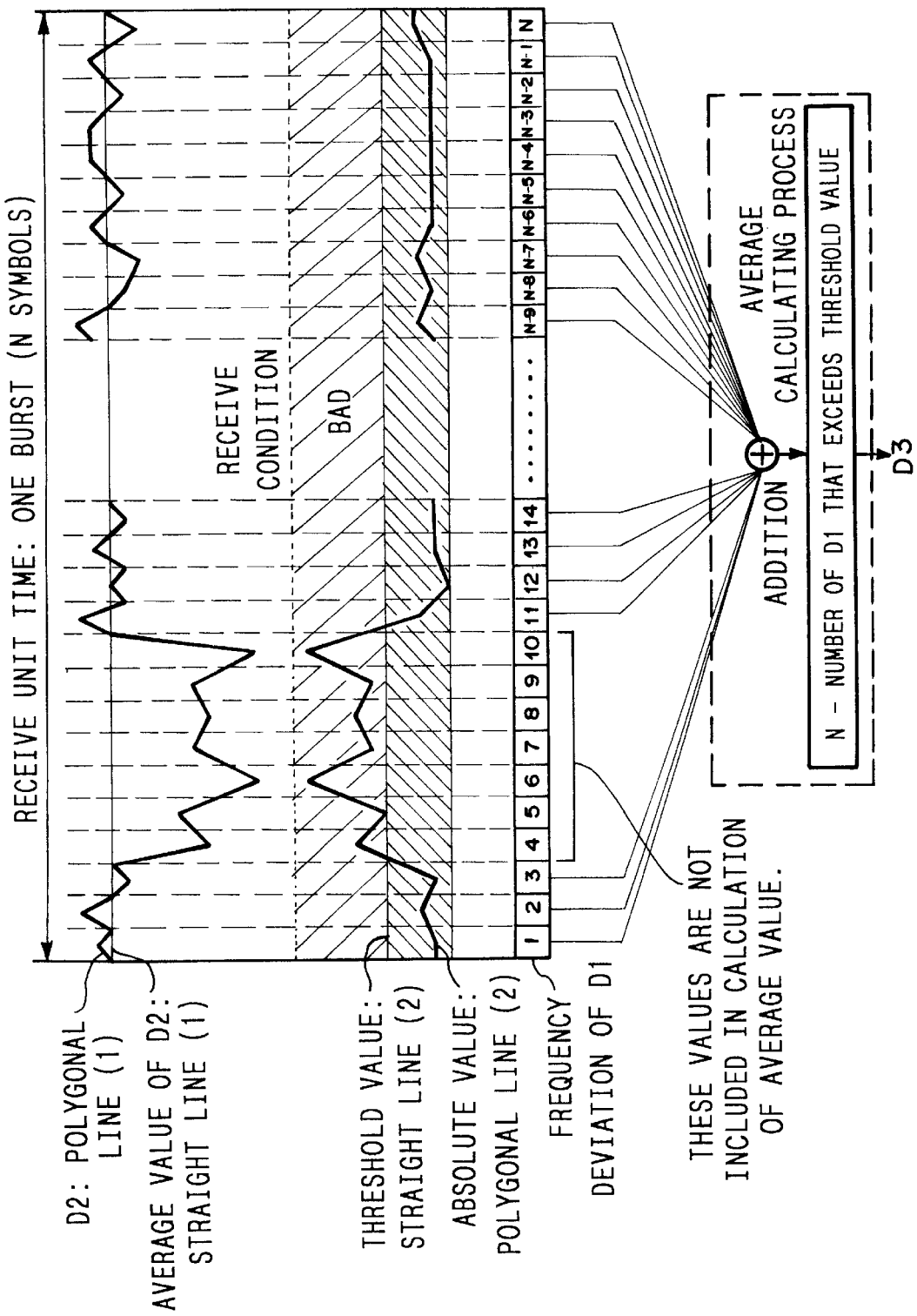

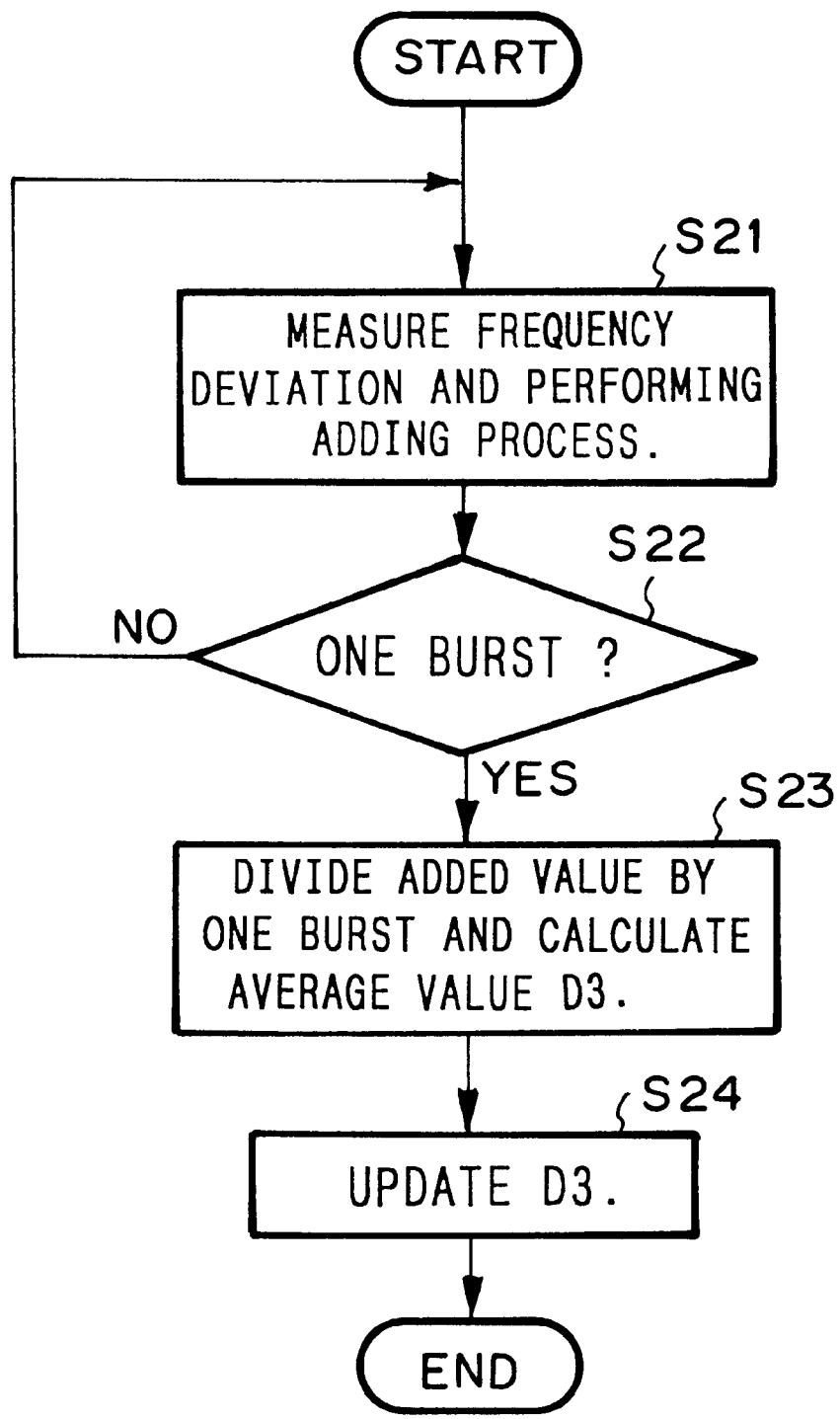

FREQUENCY ADJUSTING METHOD FOR USE WITH DIGITAL RECEIVER AND FREQUENCY ADJUSTING CIRCUIT THEREOF

BACKGROUND OF THE INVENTION

1. Field of the Invention

The present invention relates to a digital receiver for use with a mobile station or the like of a digital mobile communication, in particular, to a frequency adjusting (automatic frequency control AFC) method and a frequency adjusting circuit that cause a reference frequency of a mobile station to follow a received frequency so as to stabilize the operation of the receiver.

2. Description of the Related Art

As disclosed in Japanese Patent Laid-Open Publication No. 6-6180, a conventional mobile station uses a super heterodyne type receiver. The receiver has a local oscillator that converts the received frequency into an intermediate frequency. The local oscillator comprises a reference oscillator such as a voltage control temperature compensated quartz oscillator (hereinafter referred to as TCXO) and a means (such as PLL synthesizer) that converts the oscillation frequency of the reference oscillator into an intermediate frequency. If the oscillation frequency of the local oscillator deviates from the reference frequency, the intermediate frequency also deviates from the predetermined frequency. Thus, the received signal cannot be accurately demodulated. To cause the reference frequency of the mobile station to follow the received frequency and stabilize the operation of the receiver, the oscillation frequency of the local oscillator should be prevented from deviating. To compensate the deviation of the oscillation frequency of the local oscillator, a frequency adjusting circuit (automatic frequency control circuit AFC) is used.

FIG. 1 is a block diagram showing an example of the structure of a double super heterodyne receiver having such an AFC circuit. In FIG. 1, reference numeral 1 is a receiving antenna. Reference numeral 2 is an amplifier. Reference numeral 3 is a first mixer. Reference numeral 4 is a second mixer. Reference numeral 5 is an intermediate frequency amplifier. Reference numeral 6 is a demodulator. Reference numerals 7 and 8 are voltage control oscillators. Reference numerals 9 and 10 are PLL synthesizers. These devices compose a pair of local oscillators. Reference numeral 11 is an A/D converter. Reference numeral 20 is an AFC circuit. Reference numeral 21 is a TCXO that supplies a reference frequency to the PLL synthesizers 9 and 10. The AFC circuit 20 comprises a calculating portion 23 and a D/A converter 22.

In this structure, a RF signal received from the receiving antenna 1 is supplied to the amplifier 2. The amplifier 2 amplifies the RF signal. The amplified signal is supplied to the first mixer 3. The first mixer 3 mixes the amplified signal with a first local oscillation signal F1 generated by the voltage control oscillator 7 and the PLL synthesizer 9 and outputs a first intermediate frequency signal IF1. Next, the first intermediate frequency signal IF1 is supplied to the second mixer 4. The second mixer 4 mixes the first intermediate frequency signal IF1 with a second local oscillation signal F2 generated by the voltage control oscillator 8 and the PLL synthesizer 10 and outputs a second intermediate frequency signal IF2. The second intermediate frequency signal IF2 is supplied to the intermediate frequency amplifier 5. The intermediate frequency amplifier 5 amplifies the second intermediate frequency signal IF2. The amplified signal is supplied to the demodulator 6. The demodulator 6 demodulates the amplified signal and outputs a demodulated signal. The intermediate frequency amplifier 5 monitors the level of the electric field intensity of the received signal and outputs a receiving electric field intensity (RSSI) as a DC voltage. The output signal of the intermediate frequency amplifier 5 is supplied to the A/D converter 11. The A/D converter 11 converts the DC voltage into a digital value and supplies the digital value as a receiving electric field intensity signal D2 to the calculating portion 23. In such a manner, the receiver monitors the receiving electric field intensity.

The AFC circuit 20 compensates the deviation of the oscillation frequency of the local oscillator so as to stabilize the intermediate frequencies of the intermediate frequency signals IF1 and IF2 corresponding to the frequency of the received signal. In other words, the calculating portion 23 that is composed of a counter and so forth calculates a compensation value of the deviation of the frequency with the intermediate frequency signal D1. FIG. 5 is a flow chart showing a calculating process performed by the calculating portion 23. In FIG. 5, the frequency deviation is measured with the intermediate frequency signal D1 by each received symbol unit. The measured frequency deviations are successively added for each received symbol unit that represents signal levels "0" and "1" of digital signals (at step S21). The number of received symbol units are monitored so as to obtain the average value of the frequency deviation of the intermediate frequency signal D1 in the receiving unit time as the received symbol units (at step S22). When the predetermined number of symbol units have been detected, the flow advances to step S23. When the predetermined number of symbols have not been detected, the flow returns to step S21. At step S23, the added value of the frequency deviations is divided by the number of samples in the receiving unit time and thereby the average value is obtained. The average value is referred to as a compensation value D3 of the local oscillator. The compensation value D3 that has been obtained in the just preceding receiving unit time is substituted with the compensation value D3 that has been newly obtained (at step S24).

The D/A converter 22 converts the updated compensation value D3 into an analog DC voltage. The analog DC voltage is supplied to the TCXO 21 so as to control the oscillation frequency f0 of the TCXO 21. An output signal of the TCXO 21 is supplied to the PLL synthesizers 9 and 10. The PLL synthesizers 9 and 10 control the oscillation frequencies of the voltage control oscillators 7 and 8 so as to feed back the oscillation frequencies of the local oscillators. Thus, the deviation of the oscillation frequency f0 of the TCXO 21 and the received frequency is decreased so that the oscillation frequency of the TCXO 21 follows the received frequency RF. In addition, since the oscillation frequencies of the local oscillators are based on one reference oscillator TCXO 21, the structure can be simplified.

In the conventional AFC circuit, regardless of the receiving condition of the received signal, the frequency deviation of the intermediate frequency is always measured. With the frequency deviation, the compensation value of the oscillation frequency is calculated. Thus, when the receiving electric field intensity is low due to fading and thereby the reliability of the frequency of the received frequency degrades, the oscillation frequency is compensated with the received frequency. Thus, the reliability of the compensation of the oscillation frequency degrades and thereby the oscillation frequency cannot be precisely compensated.

This problem becomes critical when the AFC is used for a general purpose European standard digital cellular phone (GSM). In European countries, the operating environments of the digital cellular phones largely vary country by country. In addition, fading takes place due to geographical conditions. Thus, the frequency deviation may be measured with an error of the intermediate frequency signal. Thus, even if the average value of the frequency deviations is obtained, it is affected by the error. The error affects the voltage control oscillator. Consequently, the oscillation frequency cannot be accurately compensated. Thus, the conventional AFC circuit and AFC method have problems as mentioned above description.

SUMMARY OF THE INVENTION

An object of the present invention is to provide an AFC circuit and an AFC method that accurately compensate an oscillation frequency without influence of fading and strong noise components.

A first aspect of the present invention is a frequency adjusting method for use with a digital receiver, the method comprising the steps of receiving a digital signal, converting the frequency of the received signal into an intermediate frequency signal, measuring and calculating a frequency deviation of the intermediate frequency signal for each sample, controlling a local oscillator corresponding to the calculated value, detecting the receiving condition of the digital signal, and compensating the calculated value corresponding to the receiving condition.

A second aspect of the present invention is a frequency adjusting circuit for use with a digital receiver, the circuit comprising a means for converting the frequency of a received digital signal into an intermediate frequency signal, a local oscillator for supplying a local oscillation signal to the frequency converting means, and a frequency adjusting means for calculating a frequency deviation of the intermediate frequency signal for each sample, performing a predetermined calculation corresponding to the measured value, and controlling the oscillation frequency of the local oscillator corresponding to the obtained calculated value, wherein the frequency adjusting means compensates the calculated value corresponding to a receiving electric field intensity of the intermediate frequency signal.

The frequency adjusting means includes means for detecting a variation value of the receiving electric field intensity, comparing the deviation value with a threshold value, and when the variation value is larger than the threshold value, removing the frequency deviation at that time from those that are input from the frequency adjusting means.

The frequency adjusting means includes means for calculating an average value of the receiving electric field intensity in a receiving unit time, calculating the absolute value of the difference between the average value and the receiving electric field intensity for each receiving sample, comparing the absolute value with a threshold value, and when the absolute value is larger than the threshold value, removing the frequency deviation at the time from those that are input of the frequency adjusting means.

These and other objects, features and advantages of the present invention will become more apparent in light of the following detailed description of best mode embodiments thereof, as illustrated in the accompanying drawings.

BRIEF DESCRIPTION OF DRAWINGS

FIG. 2 is a flow chart for explaining a process protocol of a calculating portion according to a first embodiment of the present invention;

FIG. 4 is a schematic diagram showing a process for calculating a compensation value according to the second embodiment of the present invention; and FIG. 5 is a flow chart for explaining a process protocol of a calculating portion of a conventional AFC.

DESCRIPTION OF PREFERRED EMBODIMENTS

Figure 1:
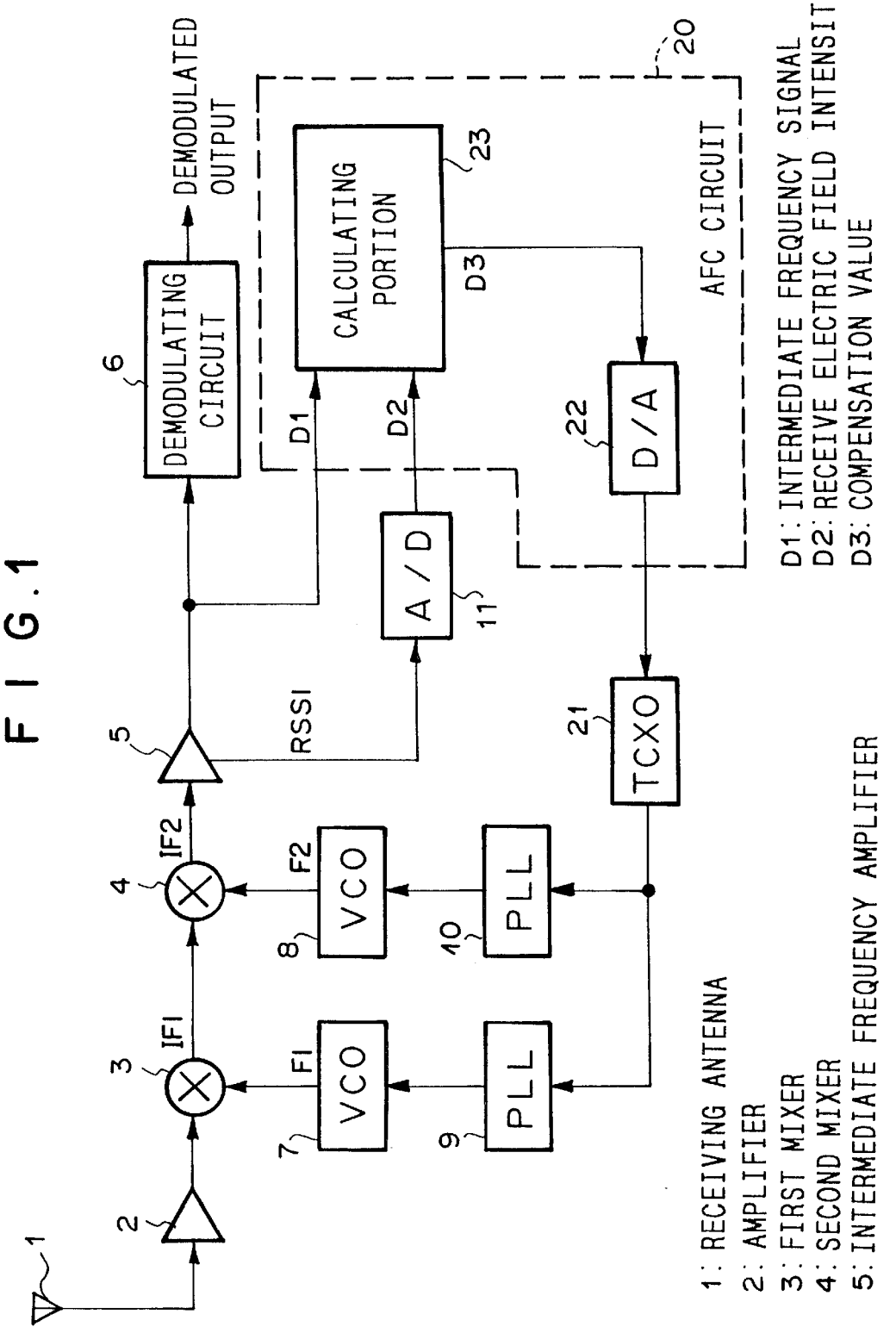
FIG. 1 is a block diagram showing a digital receiver according to the present invention.

Next, with reference to the accompanying drawings, an embodiment of the present invention will be described. In a first embodiment of the present invention, the deviation value of the receiving electric field intensity is treated as an absolute difference value of symbols in a receiving unit time. The structure of a receiver according to the first embodiment is the same as the structure of the receiver shown in FIG. 1. In other words, a signal RF received from a receiving antenna 1 is supplied to an amplifier 2. The amplifier 2 amplifies the received signal. The amplified signal is supplied to a first mixer 3. The first mixer 3 mixes the amplified signal with a first local oscillation signal F1 generated by a voltage control oscillator 7 and a PLL synthesizer 9 and outputs a first intermediate frequency signal IF1. Next, a first intermediate frequency signal IF1 is supplied to a second mixer 4. The second mixer 4 mixes the first intermediate frequency signal IF1 with a second local oscillation signal F2 generated by a voltage control oscillator 8 and a PLL synthesizer 10 and outputs a second intermediate frequency signal IF2. The second local oscillation signal IF2 is supplied to an intermediate frequency amplifier 5. The intermediate frequency amplifier 5 amplifies the second intermediate frequency signal IF2. The amplified signal is supplied to a demodulator 6. The demodulator 6 demodulates the amplified signal and outputs a demodulated signal. The intermediate frequency amplifier 5 monitors the level of the electric field intensity of the received signal and outputs a receiving electric field intensity (RSSI) as a DC voltage. The DC voltage is supplied to an A/D converter 11. The A/D converter 11 converts the DC voltage into a digital value D2. The digital value D2 is supplied to a calculating portion 23 of an AFC circuit 20. Thus, the receiver monitors the receiving electric field intensity. The AFC circuit 20 supplies a frequency deviation to the calculating portion 23 so that the intermediate frequencies of the intermediate frequency signals IF1 and IF2 follow the frequency of the received RF signal and stabilizes them. The calculating portion 23 outputs a compensation value D3 for compensating the deviation of the oscillation frequency of the local oscillator received from the calculating portion 23.

In the calculating portion 23 according to the first embodiment, the process protocol for obtaining the compensation value D3 with the frequency deviation and the receiving electric field intensity D2 is different from a conventional process protocol. FIG. 2 is a flow chart of the process protocol of the calculating portion 23. The receiving electric field intensity D2 that is a digital value of the receiving electric field intensity (RSSI) is stored for the receiving unit time (at step S01). The deviation value of the receiving electric field intensity is obtained for the receiving unit time with the receiving electric field intensity D2 stored at step S01 (at step S02). Assuming that the receiving unit time is a time for which one burst (data of N symbols) is received, the deviation value of the receiving electric field intensity is the absolute value of the difference between the (N−1)th value of the receiving electric field intensity D2 and the N-th value of the receiving electric field intensity D2. In other words, the difference absolute value is obtained as |(N−1)th receiving electric field intensity − N-th receiving electric field intensity|. In addition, the absolute value obtained at step S03 is compared with a predetermined threshold value (at step S03). As the compared result at step S03, when the absolute value is larger than the threshold value, the flow advances to step S05. When the absolute value is smaller than the threshold value, the flow advances to step S06 (at step S04).

The frequency deviation of the intermediate frequency signal D1 whose intensity absolute value is larger than the threshold value is not used for the calculation of the average value (at step S05). For example, when the deviation of the receiving electric field intensity due to fading is larger than 14 dB, since the reliability of the received signal becomes low, assuming that the threshold value is 14 dB, if the obtained absolute value A is larger than 14 dB (namely, the receiving condition is bad due to fading), the frequency deviation of the intermediate frequency signal D1 is not included in the added value used for the calculation of the average value (namely, the frequency deviation of the intermediate frequency signal D1 whose reliability is low is removed), the error due to fading can be alleviated. In this example, although it is assumed that the threshold value is 14 dB, the threshold value is not limited to 14 dB. The average value of the frequency deviations of the intermediate frequency signal D1 is obtained in the receiving unit time (namely, the number of received symbols is counted) (at step S06). As the determined result at step S06, when the predetermined number of symbols have been received, the flow advances to step S07. When the predetermined number of symbols have not been received, the flow returns to step S02. Since the added value of which the frequency deviation of the intermediate frequency signal D1 whose reliability is low is removed at step S05 is divided by the number of symbols. Thereby, the average value D3 of the frequency deviations of the intermediate frequency signal D1 from which the error has been removed is obtained (at step S07). The compensation value that has been obtained in the just preceding receiving unit time is substituted with the average value D3 obtained at step S07 as a new compensation value and updated. The updated compensation value D3 is supplied to the D/A converter 22. The D/A converter 22 converts the compensation value D3 into an analog value. With the analog value, the oscillation value of the TCXO 21 is controlled. Thus, the error due to fading is decreased and thereby the AFC can be accurately compensated.

Thus, in the first embodiment, when the receiving electric field intensity sharply varies due to fading (namely, the deviation of the receiving electric field intensity is larger than the threshold value), it is determined that the reliability of the frequency deviation of the intermediate frequency signal at the time is low. Thus, the frequency deviation is removed and thereby the average value of the frequency deviations of the remaining intermediate frequency signal D1 is obtained. Consequently, a compensation value is obtained. Thus, the influence due to fading can be alleviated. As a result, the AFC can be more accurately controlled than before.

Figure 3:
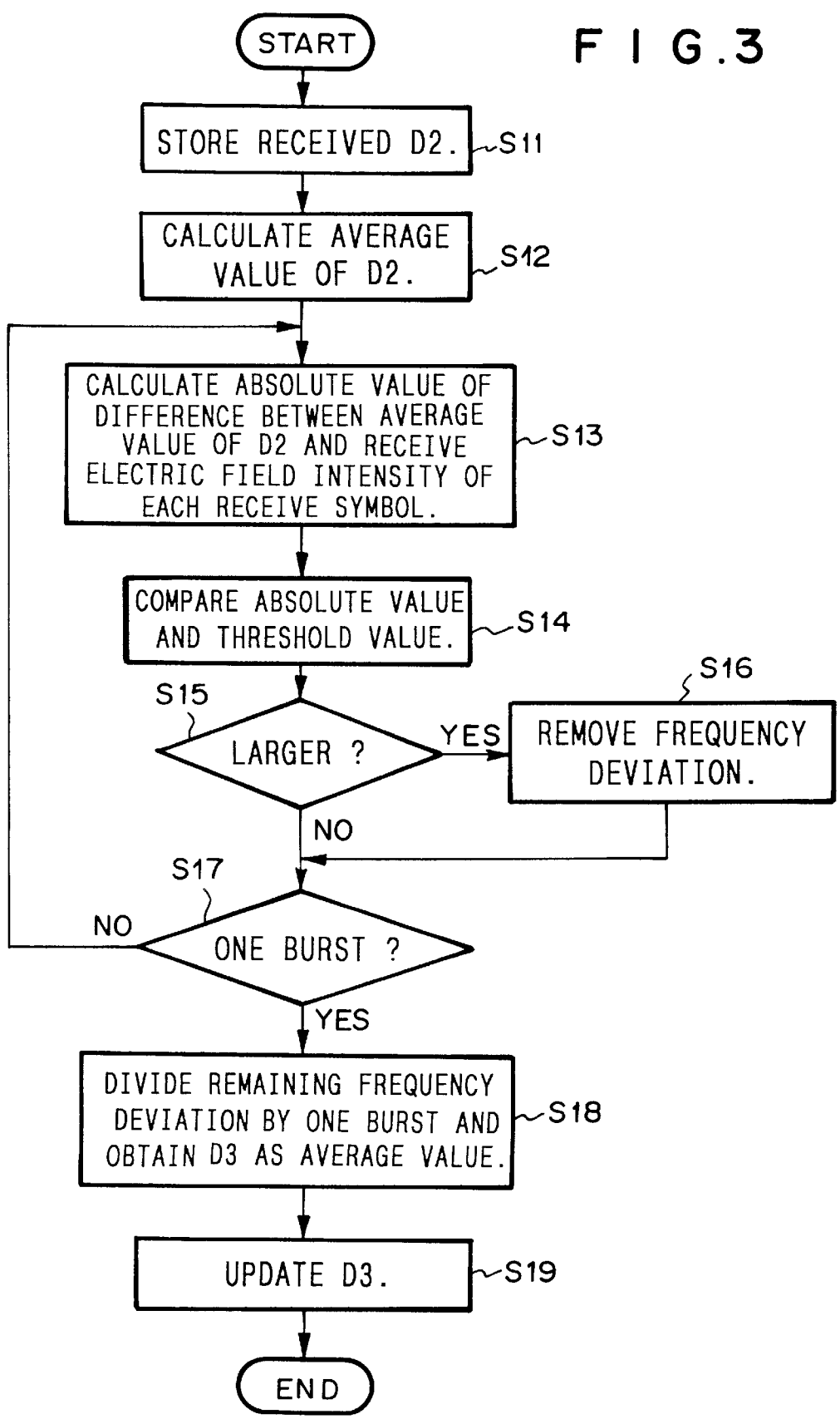
FIG. 3 is a flow chart for explaining a process protocol of a calculating portion according to a second embodiment of the present invention.

FIG. 3 is a flow chart for explaining a second embodiment of the present invention. As with the first embodiment, FIG. 3 shows a process protocol of the calculating portion 23 of the AFC circuit of the receiver shown in FIG. 1. In the second embodiment, in addition to determining the sharp deviation of the receiving electric field intensity, the receiving electric field intensity of each symbol is evaluated. Thus, the receiving condition can be more accurately determined. A receiving electric field intensity D2 is stored for a receiving unit time (at step S11). With the receiving electric field intensity D2 stored at step S11, the average value of the receiving electric field intensity for the receiving unit time is obtained (at step S12). For example, assuming that the receiving unit time is a time for which one burst (data of N symbols) is received, the average value of the receiving electric field intensity is obtained by adding the receiving electric field intensity D2 for N symbols and dividing the result by N symbols. The absolute value of the difference between the average value of D2 obtained at step S12 and the receiving electric field intensity D2 of each received symbol is obtained (at step S13). The absolute value of the difference of the average value is obtained as |(average value of receiving electric field intensity in receiving unit time)− (receiving electric field intensity of each received symbol)|. The absolute value obtained at step S13 is compared with the threshold value (at step S14). As the compared result at step S14, when the absolute value is larger than the threshold value, the flow advances to step S16. When the absolute value is smaller than the threshold value, the flow advances to step S17 (at step S15).

The frequency deviation of the intermediate frequency signal D1 whose absolute value is larger than the threshold value is not used for the calculation of the average value (at step S16). For example, when the deviation width of the receiving electric field intensity is larger than 14 dB due to fading, since the reliability of the received signal becomes low, assuming that the threshold value is 14 dB, if the absolute value is larger than 14 dB (namely, the receiving condition is bad due to fading), the frequency deviation of the intermediate frequency signal D1 at the time is not included in the added value used for the calculation of the average value (namely, the frequency deviation is removed as a frequency deviation of the intermediate frequency signal D1 whose reliability is low) and, the error due to fading can be alleviated. In this example, the threshold value is 14 dB. However, according to the present invention, the threshold value is not limited to 14 dB.

Next, the number of received symbols is counted so that the average value of the frequency deviations of the intermediate frequency signal D1 is obtained (at step S17). When the predetermined number of symbols have been received, the flow advances to step S18. When the predetermined number of symbols have not been received, the flow returns to step S13. The frequency deviation D1 of the intermediate frequency signal D1 whose reliability is low has been removed and then the added value is divided by the number of symbols. Thus, the average value D3 of the frequency deviations of the intermediate frequency signal from which the error has been removed is obtained (at step S18). The compensation value that has been obtained in the just preceding receiving unit time is substituted with the average value D3 of the frequency deviations of the intermediate frequency signal D1 obtained at step S18 as a new compensation value and thereby updated. The compensation value D3 is supplied to the D/A converter 22. The D/A converter 22 converts the compensation value D3 into an analog value. With the analog value, the oscillation frequency of the TCXO 21 is controlled. Thus, the error due to fading is decreased and thereby the AFO circuit is accurately compensated.

Next, with reference to FIG. 4, the determination of the receiving condition and the selection of the frequency deviations corresponding to the receiving electric field intensity according to the second embodiment will be described. The average value (straight line 1) of the receiving electric field intensity D2 (polygonal line) in the receiving unit time (one burst) is obtained. The absolute value (polygonal line 2) of the difference between the obtained average value and the receiving electric field intensity of each symbol is calculated. The absolute value represents the deviation from the average value. With the threshold value (straight line 2), the receiving condition can be determined. When the receiving electric field intensity D2 largely deviates from the average value (namely, the receiving condition is bad), the absolute value largely deviates. When the receiving electric field intensity D2 is larger than the threshold value, since the receiving condition is bad, since the reliability of the frequency deviation measured with the intermediate frequency signal D1 at the time is low, it is removed from the calculation of the average value. With the remaining frequency deviations, the calculation of the average value is calculated and thereby the compensation value D3 is obtained. The obtained compensation value D3 is supplied to the D/A converter 22. The D/A converter 22 converts the compensation value D3 into an analog value. With the analog value, the oscillation frequency of the TCXO 21 is controlled.

As described above, according to the present invention, the receiving condition is detected with the receiving electric field intensity of the received digital signal. Corresponding to the receiving condition, the calculated value for controlling the local oscillator corresponding to the frequency deviations is compensated. Thus, even if the receiving electric field intensity sharply varies due to fading (namely, the receiving electric field intensity largely varies than the threshold value) or strong impulse noises like mobile spark noises, it is determined that the reliability of the frequency deviation at the time is low. Thus, the frequency deviation at the time is deleted. The average value of the remaining frequency deviations is obtained. Consequently, the influence of fading is alleviated and the local oscillator can be more accurately controlled.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A frequency adjusting method for use with a digital receiver, the method comprising the steps of:

receiving a digital signal;

converting the frequency of the received digital signal into an intermediate frequency signal;

measuring and calculating a frequency deviation of the intermediate frequency signal for each sample to obtain a calculated value;

controlling a local oscillator corresponding to the calculated value;

detecting a receiving condition of the digital signal which presents a sharp deviation of a receiving electric field intensity to obtain a deviation value; and compensating the calculated value corresponding to the receiving condition;

wherein the deviation value of the receiving electric field intensity is obtained for a receiving time equal to one burst (data of N symbols, where N is an integer);

the deviation value of the receiving electric field intensity being the absolute value of the difference between the (N−1)th value of the receiving electric field intensity and the N-th value of the receiving electric field intensity; and further, wherein the compensating step includes comparing the difference absolute value with a predetermined threshold value, and removing the N-th value from the measuring and calculating step when the absolute value exceeds said predetermined threshold value.

2. The frequency adjusting method as set forth in claim 1, wherein the receiving condition is whether or not a fading exists over a predetermine level.

3. A frequency adjusting circuit for use with a digital receiver, the circuit comprising:

a converter for converting the frequency of a received digital signal into an intermediate frequency signal;

a local oscillator for supplying a local oscillation signal to said converter;

a frequency adjuster for calculating a frequency deviation of the intermediate frequency signal for each sample, performing a predetermined calculation corresponding to a measured value, and controlling the oscillation frequency of said local oscillator corresponding to the obtained calculated value; and a monitor for monitoring a receiving condition of which presents a sharp deviation of a receiving electric field intensity, wherein said frequency adjuster includes a calculator for calculating an average value of the receiving electric field intensity in a receiving unit time, calculating the absolute value of the difference between the average value and the receiving electric field intensity for each receiving sample, comparing the absolute value with a threshold value, and when the absolute value is larger than the threshold value, removing the frequency deviation at the time from those that are input of said frequency adjuster.

4. The frequency adjusting circuit as set forth in claim 3, wherein the receiving condition is whether or not a fading exists over a predetermine level during plural symbol units of the received digital signal.

5. The frequency adjusting circuit as set forth in claim 3, wherein said frequency adjuster includes means for detecting a variation value of the receiving electric field intensity, comparing the deviation value with a threshold value, and when the variation value is larger than the threshold value, removing the frequency deviation at that time from those that are input from said frequency adjusting means.

6. A frequency adjusting circuit for use with a digital receiver, the circuit comprising:

a converter for converting the frequency of a received digital signal into an intermediate frequency signal;

a local oscillator for supplying a local oscillation signal to said frequency converter;

a frequency adjuster for calculating a frequency deviation of the intermediate frequency signal for each sample, performing a predetermined calculation corresponding to a measured value, and controlling the oscillation frequency of said local oscillator corresponding to the obtained calculated value; and a monitor for monitoring a receiving condition of which presents a frequency deviation of a receiving electric field intensity;

wherein the received condition is determined using an average value of the receiving electric field intensity in a receiving unit time (one burst data of N symbols, where N is an integer), an absolute value of the difference between the obtained average value and the receiving electric field intensity of each symbol is calculated in said frequency adjuster and wherein the absolute value representing the frequency deviation from the average value is compared with a predetermined threshold value; and wherein when the receiving electric field intensity deviates from the average value by the predetermined threshold value, it is removed from the calculation of the average value.

7. The frequency adjusting circuit as set forth in claim 6, wherein said local oscillator comprises a phase locked loop circuit, a variable oscillator and a TCXO.

8. The frequency adjusting circuit as set forth in claim 6, wherein said local oscilator comprises a phase locked loop circuit, a variable oscillator and a TCXO supplied with an average value from a D/A converter connected to said frequency adjuster.

* * * * *